US012785515B2

(12) United States Patent
Katagiri et al.

(10) Patent No.: US 12,785,515 B2
(45) Date of Patent: Nov. 3, 2026

(54) CORE MEMBER OF CURRENT DETECTOR, CURRENT DETECTOR, AND POWER CONVERSION DEVICE

(71) Applicant: HITACHI ASTEMO, LTD., Hitachinaka (JP)

(72) Inventors: Kazushige Katagiri, Hitachinaka (JP); Kiyotaka Kanno, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 195 days.

(21) Appl. No.: 18/722,726

(22) PCT Filed: Feb. 21, 2022

(86) PCT No.: PCT/JP2022/007051
§ 371 (c)(1),
(2) Date: Jun. 21, 2024

(87) PCT Pub. No.: WO2023/157316
PCT Pub. Date: Aug. 24, 2023

(65) Prior Publication Data
US 2025/0055354 A1 Feb. 13, 2025

(51) Int. Cl.

| | |
|---|---|
| ***H02K 11/27*** | (2016.01) |
| ***B60L 15/00*** | (2006.01) |
| ***G01R 15/18*** | (2006.01) |
| ***G01R 19/00*** | (2006.01) |
| *H02M 7/00* | (2006.01) |

(52) U.S. Cl.
CPC ............ *H02K 11/27* (2016.01); *B60L 15/007* (2013.01); *G01R 15/183* (2013.01); *G01R 19/0092* (2013.01); *B60L 2210/30* (2013.01); *B60L 2210/40* (2013.01); *H02K 2211/03* (2013.01); *H02M 7/003* (2013.01)

(58) Field of Classification Search
CPC ... H02K 11/27; H02K 2211/03; B60L 15/007; B60L 2210/30; B60L 2210/40; G01R 15/183; G01R 19/0092; H02M 7/003
See application file for complete search history.

(56) References Cited

U.S. PATENT DOCUMENTS

2009/0039880 A1 2/2009 Nomura et al.
2012/0299589 A1* 11/2012 Yoshimori ........... G01R 15/202 324/252
2017/0343586 A1* 11/2017 Oka ..................... G01R 15/183

FOREIGN PATENT DOCUMENTS

JP H04-315059 A 11/1992
JP 2007-088019 A 4/2007
JP 2009-042003 A 2/2009
(Continued)

OTHER PUBLICATIONS

International Search Report with English Translation in corresponding International Application No. PCT/JP2022/007051, dated May 10, 2022.

*Primary Examiner* — Viet P Nguyen
(74) *Attorney, Agent, or Firm* — Foley & Lardner LLP

(57) ABSTRACT

A core member of a current detector includes an annular core having a magnetic gap, a first mold portion sealing a part of the core, and a second mold portion sealing the first mold portion, in which the first mold portion has a pair of pressing surfaces with the magnetic gap being interposed therebetween, and the pair of pressing surfaces are sealed by the second mold portion.

13 Claims, 7 Drawing Sheets

(56) References Cited

FOREIGN PATENT DOCUMENTS

| | | | |
|---|---|---|---|
| JP | 2011-153935 | A | 8/2011 |
| JP | 2013-120106 | A | 6/2013 |
| JP | 2014-077682 | A | 5/2014 |
| JP | 2015-175757 | A | 10/2015 |
| WO | WO-2016/067863 | A1 | 5/2016 |

* cited by examiner

CORE MEMBER OF CURRENT DETECTOR, CURRENT DETECTOR, AND POWER CONVERSION DEVICE

TECHNICAL FIELD

The present invention relates to a core member of a current detector, a current detector, and a power conversion device.

BACKGROUND ART

A power conversion device that converts a direct current into an alternating current includes a current detector that detects a current flowing through a bus bar. The current detector measures a magnetic flux generated by the current flowing through the bus bar, using a core through which the bus bar is inserted and an electromagnetic conversion element disposed in a magnetic gap of the core. In particular, in a power conversion device for a vehicle requiring reliability, high accuracy vibration and resistance are required for mounting a core constituting a current detector.

PTL 1 discloses a current detector in which a core component includes a core and a mold resin portion molded at one or more positions along a magnetic path of the core to cover a surface of the core, the core component being fixed inside an exterior case in a state where a surface of the mold resin portion is in contact with the inner surface of the exterior case.

CITATION LIST

Patent Literature

PTL 1: JP 2011-153935 A

SUMMARY OF INVENTION

Technical Problem

The current detector described in PTL 1 has problems in accuracy and vibration resistance in core mounting.

Solution to Problem

A core member of a current detector according to the present invention includes an annular core having a magnetic gap, a first mold portion sealing a part of the core, and a second mold portion sealing the first mold portion, in which the first mold portion has a pair of pressing surfaces with the magnetic gap being interposed therebetween, and the pair of pressing surfaces are sealed by the second mold portion.

Advantageous Effects of Invention

According to the present invention, it is possible to provide a highly reliable current detector having high accuracy and vibration resistance in core mounting.

DESCRIPTION OF EMBODIMENTS

Figure 1:
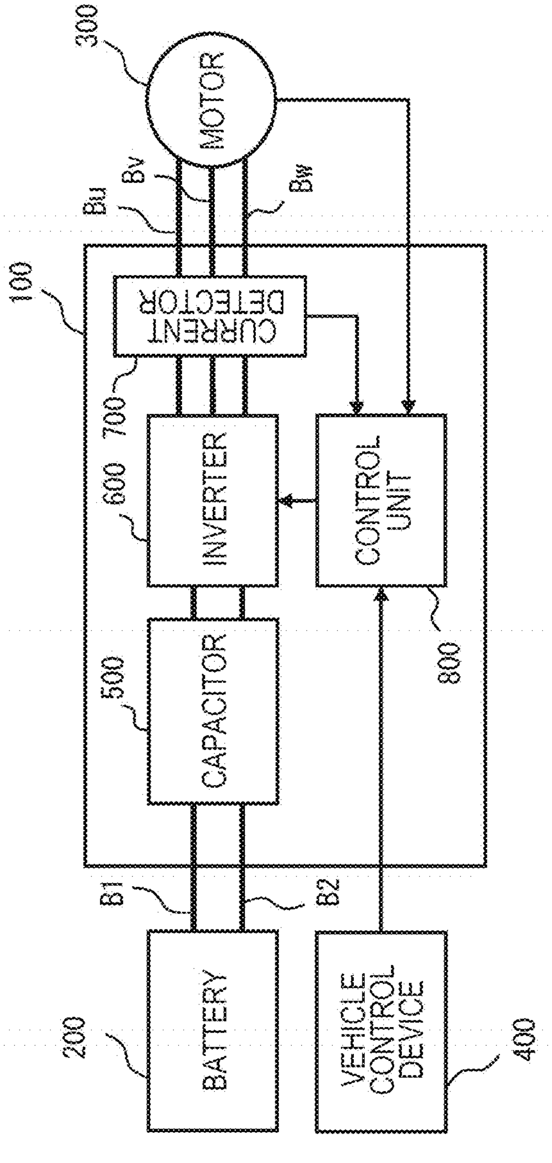
FIG. 1 is a circuit configuration diagram of a power conversion device.

Hereinafter, an embodiment of the present invention will be described with reference to the drawings. The following description and drawings are examples for explaining the present invention, and are omitted and simplified as appropriate for clarity of explanation. The present invention can be carried out in various other forms. Unless otherwise specified, each component may be singular or plural.

Positions, sizes, shapes, ranges, and the like of components illustrated in the drawings may not represent actual positions, sizes, shapes, ranges, and the like in order to facilitate understanding of the invention. Therefore, the present invention is not necessarily limited to the positions, sizes, shapes, ranges, and the like disclosed in the drawings.

FIG. 1 is a circuit configuration diagram of a power conversion device 100.

The power conversion device 100 converts DC power from a battery 200 into AC power to drive a motor 300. When the motor 300 is rotated by an external force to function as a generator, the power conversion device 100 converts the generated AC power into DC power to charge the battery 200. The battery 200 is a chargeable and dischargeable secondary battery, and a DC voltage is applied to the power conversion device 100 via DC bus bars B1 and B2 connected to a positive electrode and a negative electrode of the battery 200. The motor 300 is, for example, a three-phase synchronous motor having three-phase windings therein. Three-phase AC currents output from the power conversion device 100 via AC bus bars Bu, Bv, and Bw flow through the windings of the respective phases of the motor 300.

The power conversion device 100, the battery 200, and the motor 300 are mounted on, for example, a vehicle, and a vehicle control device 400 also mounted on the vehicle outputs a torque command or the like for the motor 300 to the power conversion device 100.

The power conversion device 100 includes a capacitor 500, an inverter 600, a current detector 700, and a control unit 800.

The capacitor 500 includes a noise removing capacitor and a smoothing capacitor. Switching legs for the three phases are connected to the inverter 600 between the DC bus bars B1 and B2, each switching leg including a switching element of an upper arm and a switching element of a lower arm. The power semiconductor element is, for example, an insulated gate bipolar transistor (IGBT) or a metal oxide semiconductor field effect transistor (MOSFET). The inverter 600 converts DC power into AC power and converts AC power into DC power.

The current detector 700, which will be described in detail below, measures a magnetic flux generated by the currents flowing through the AC bus bars Bu, Bv, and Bw, using cores through which the AC bus bars Bu, Bv, and Bw are inserted and an electromagnetic conversion element disposed in a magnetic gap of the core, to obtain a current value. Although it is described as an example in the present embodiment that the AC bus bars Bu, Bv, and Bw are inserted through the cores, DC bus bars for transmitting DC power may be inserted through the cores.

Based on the current value detected by the current detector 700, a rotation angle of the motor 300 detected by a resolver or the like installed in the motor 300, and a voltage value (not illustrated) input from the battery 200, the control unit 800 drives and controls the inverter 600 to perform optimal control according to the torque command output from the vehicle control device 400 and achieve optimal efficiency. This control improves vehicle behaviors such as responsivity and operability. That is, by providing the highly reliable current detector 700 having high detection accuracy and vibration resistance while suppressing a deterioration in magnetic characteristic as described in the present embodiment, it can be expected to improve the vehicle behaviors and improve the efficiency of the motor 300.

Figure 2:
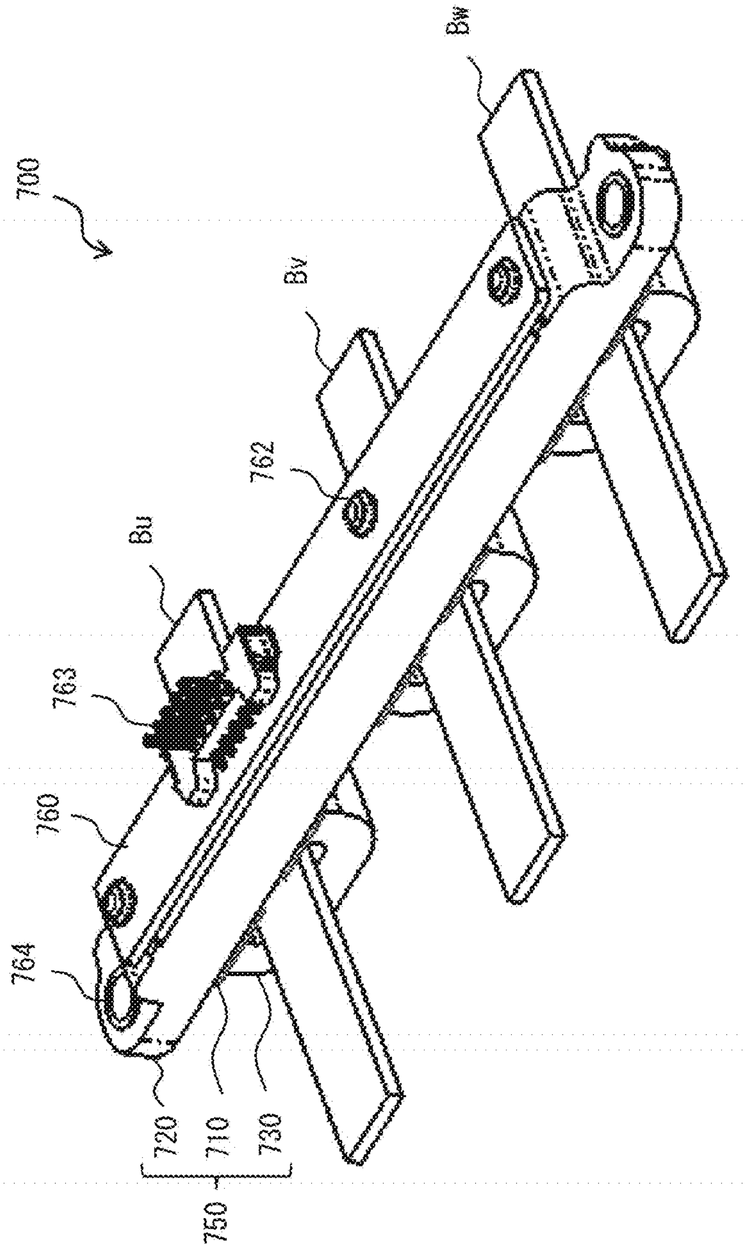
FIG. 2 is an external perspective view of a current detector.

FIG. 2 is an external perspective view of the current detector 700.

A core member 750 of the current detector 700 includes an annular core 730 having a magnetic gap M, a first mold portion 710 sealing a part of the core 730, and a second mold portion 720 sealing the first mold portion 710. The first mold portion 710 and the second mold portion 720 are molded by sealing a mold resin such as an insulating synthetic resin in molds.

The first mold portion 710, which will be described in detail below, seals a part of the core 730. The second mold portion 720 seals a part of the first mold portion 710 so as to connect the core members 750 for three phases. Concerning the core members 750, the AC bus bars Bu, Bv, and Bw are inserted through the core members 750 for three phases, respectively. A circuit board 760 is installed on an upper surface of the second mold portion 720.

Figure 3:
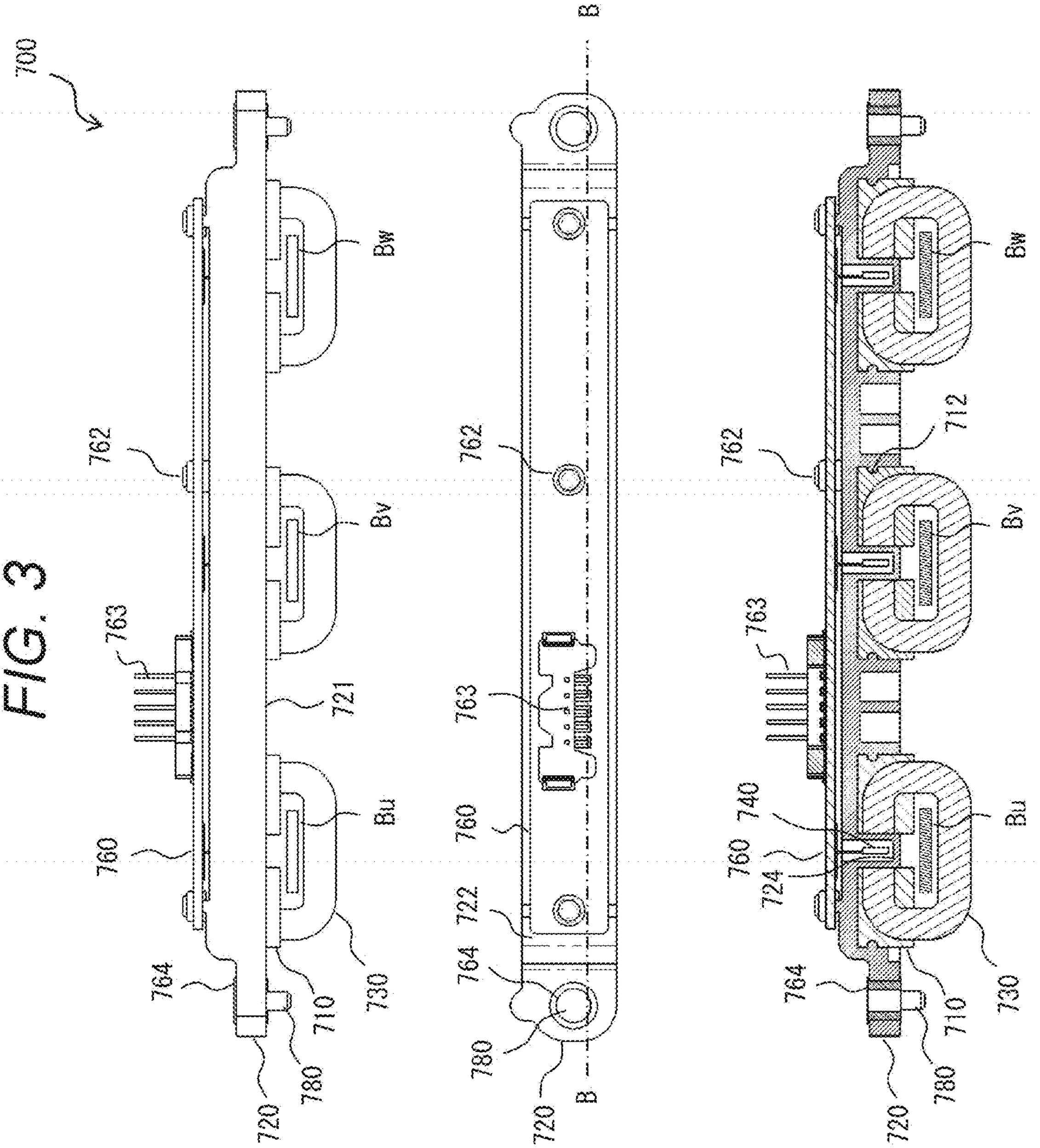
FIGS. 3(A), 3(B), and 3(C) are a side view, a top view, and a cross-sectional view of the current detector.

An electromagnetic conversion element disposed in the magnetic gap M of the core 730 is mounted on the circuit board 760, and the circuit board 760 is fixed to the second mold portion 720 in a thermally caulked manner by resin bosses 762 formed at three places in the second mold portion 720. The bosses 762 also serve to position the circuit board 760 with respect to the second mold portion 720. Since the circuit board 760 is positioned by the bosses 762, a position from the magnetic gap M to the electromagnetic conversion element 740 (see FIG. 3(C)) mounted on the circuit board 760 is determined by the bosses 762. The circuit board 760 may be fixed to second mold portion 720 by using a fastening member such as a screw instead of the bosses 762. The circuit board 760 includes a connector 763, and a voltage value based on a detection value measured by the electromagnetic conversion element is output to the control unit 800 via the connector 763.

The core 730, the first mold portion 710, and the circuit board 760 are integrally fixed to the second mold portion 720 to constitute the current detector 700. The current detector 700 is fixed to a housing of the power conversion device 100 by screwing collars 764 to both ends of the second mold portion 720 in a state where the current detector 700 is positioned by positioning pins 780 (see FIG. 3).

FIGS. 3(A), 3(B), and 3(C) are a side view, a top view, and a cross-sectional view of the current detector 700. FIG. 3(A) is a side view, FIG. 3(B) is a top view, and FIG. 3(C) is a cross-sectional view taken along line B-B of FIG. 3(B).

As illustrated in FIG. 3(A), the core 730 and the first mold portion 710 protrude from a lower end surface 721 of the second mold portion 720. As illustrated in FIG. 3(B), the circuit board 760 is fixed to a board mounting surface 722, which is an upper end surface of the second mold portion 720, by three bosses 762. As illustrated in FIG. 3(C), the electromagnetic conversion element 740 is mounted on the circuit board 760 and disposed in the magnetic gap of the core 730. That is, the second mold portion 720 has a board mounting surface 722 on which the circuit board 760 is mounted and has a groove portion 724 recessed from the board mounting surface 722 toward the magnetic gap, and the electromagnetic conversion element 740 is accommodated in the groove portion 724. Note that, although it is described as an example in the present embodiment that the electromagnetic conversion element 740 is mounted on the circuit board 760, the circuit board 760 can be omitted by mounting the electromagnetic conversion element 740 on the control unit 800.

When the current detector 700 is fixed to the housing (not illustrated) of the power conversion device 100, it is necessary to secure a safe insulation distance because the power conversion device 100 for a vehicle uses a high voltage. Thus, the current detector 700 is fixed to the housing of the power conversion device 100 with the necessary insulation distance secured therebetween.

Figure 4:
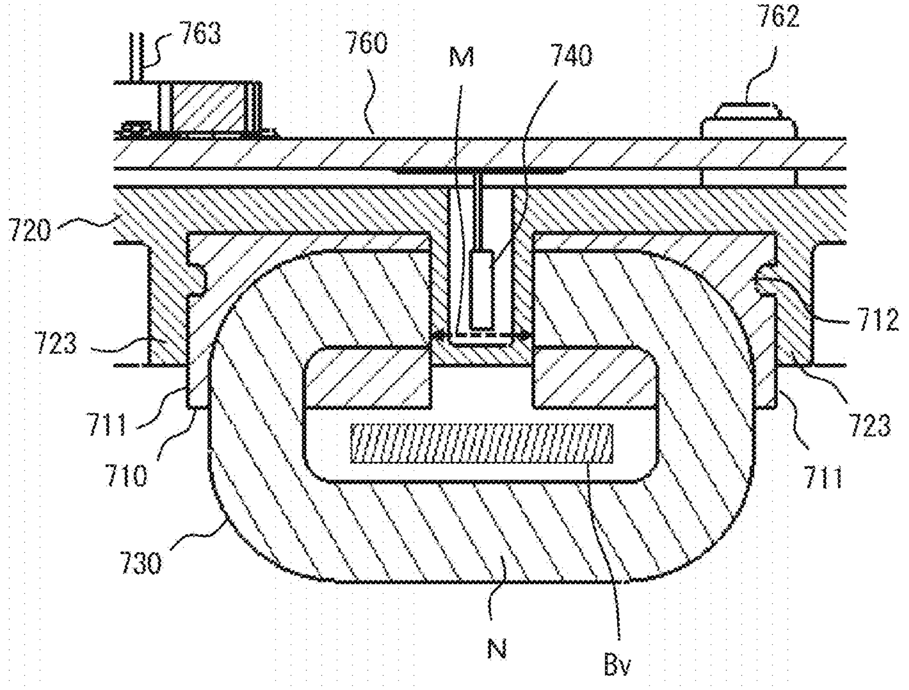
FIG. 4 is a partially enlarged cross-sectional view of the current detector.

FIG. 4 is a partially enlarged cross-sectional view of the current detector 700. FIG. 4 is an enlarged view of the current detector 700 in the vicinity of the AC bus bar Bv in the current detector 700 illustrated in FIG. 3(C).

The core 730 is a wound core formed by spirally winding a magnetic strip. The wound core is obtained by winding and bonding a magnetic strip and cutting the magnetic strip. For the wound core, a directional electromagnetic steel plate is used as a magnetic strip, the directional electromagnetic steel plate having an excellent magnetic characteristic in linearity and the like capable of setting a magnetic flux density high compared with a non-directional as electromagnetic steel plate. Therefore, the size of the wound core can be reduced. On the other hand, by winding the magnetic strip, the dimension of the core 730 tends to vary. Therefore, in the present embodiment, the first mold portion 710 is formed to be larger than the outer shape of the core 730, and sealed with the second mold portion 720, thereby absorbing a dimensional variation of the core 730.

In addition, the first mold portion 710 includes a pair of mold portions each sealing a part of the core 730, with the magnetic gap M being interposed therebetween. That is, the first mold portion 710 molds the magnetic gap M side with less magnetic flux saturation while avoiding a magnetic flux saturated portion N of the core 730. The magnetic flux saturated portion N is located at a position opposite to the position of the magnetic gap M of the core 730 with the AC bus bar Bv being interposed therebetween, but the magnetic flux density decreases if external stress is applied to the magnetic flux saturated portion N. In the present embodiment, since the first mold portion 710 and the second mold portion 720 are not formed in the magnetic flux saturated portion N, it is possible to prevent stress at the time of molding and external force after molding from being applied to the magnetic flux saturated portion N, suppress a deterioration in magnetic characteristic, and provide a current detector 700 having high detection accuracy.

As illustrated in FIG. 4, the first mold portion 710 has a pair of pressing surfaces 711 with the magnetic gap M interposed therebetween. The second mold portion 720 has a pressing portion 723 facing the pressing surfaces 711 of the first mold portion 710, and the pressing portion 723 presses parts of the pressing surface 711 of the first mold portion

710. That is, the pair of pressing surfaces 711 are integrally sealed while being pressed by the pressing portion 723 of the second mold portion 720.

More specifically, the pair of pressing surfaces 711 are outer surfaces on the sides opposite to the magnetic gap M side in the pair of mold portions, and are formed outside the outer shape of the core 730. Since the pair of pressing surfaces 711 with the magnetic gap M interposed therebetween press the core 730 via the first mold portion 710 at the pressing portion 723 during the molding of the second mold portion 720, the dimensional variation of the magnetic gap M and the positioning of the magnetic gap M with respect to the second mold portion 720 can be performed with high accuracy, and the current detector 700 having high accuracy can be provided. That is, the size of the magnetic gap M is suppressed from varying due to the influence of external force, aging, or the like. The pressing surface 711 is set to a surface facing the direction in which the core 730 is deformed. In the example of FIG. 4, it is illustrated that the core 730 tends to expand outward, widening the magnetic gap M.

The pressing surface 711 is not limited to the outer surface on the side opposite to the magnetic gap M side, and can be set to a surface that suppresses a deformation of the core 730, for example, a surface on the magnetic gap M side, an upper surface, a lower surface, or the like. By sealing and fixing the pressing surface 711 with the pressing portion 723 of the second mold portion 720 facing the pressing surface 711, a deformation of the magnetic gap M of the core 730 in an enlargement/reduction direction and a wobble of the core 730 can be suppressed. The pressing portion 723 improves the positional accuracy of the core 730 and the positional accuracy of the circuit board 760 with respect to the core 730.

The pair of pressing surfaces 711 of the first mold portion 710 are exposed from the portions where the first mold portion 710 is sealed by the second mold portion 720. This is because, while the exposed portions are held by a jig or the like in a state where the core 730 is molded by the first mold portion 710, the molding of the second mold portion 720, which is a next process, is performed. In this process, a variation in dimension (the widening of the gap) at the time of forming the magnetic gap M can be suppressed, and a variation in magnetic characteristic can be suppressed. In addition, it is also possible to prevent external force from being applied to the magnetic flux saturated portion N of the core 730 by the jig or the like.

The variation in magnetic characteristic of the core 730 is affected by a deformation in the magnetic gap M. In the present embodiment, the second mold portion 720 presses parts of the pressing surfaces 711 of the first mold portion 710 at the pressing portion 723, such that the first mold portion 710 is integrally sealed by the second mold portion 720. Further, the second mold portion 720 seals the first mold portion 710 so as to connect the core members 750 for three phases. With such a configuration, it is possible to obtain a strong structure that suppresses a deformation of the magnetic gap M. Accordingly, it is possible to suppress a deformation of the magnetic gap M even if the vehicle or the like vibrates, and to provide a highly reliable current detector having high accuracy and vibration resistance.

Figure 5:
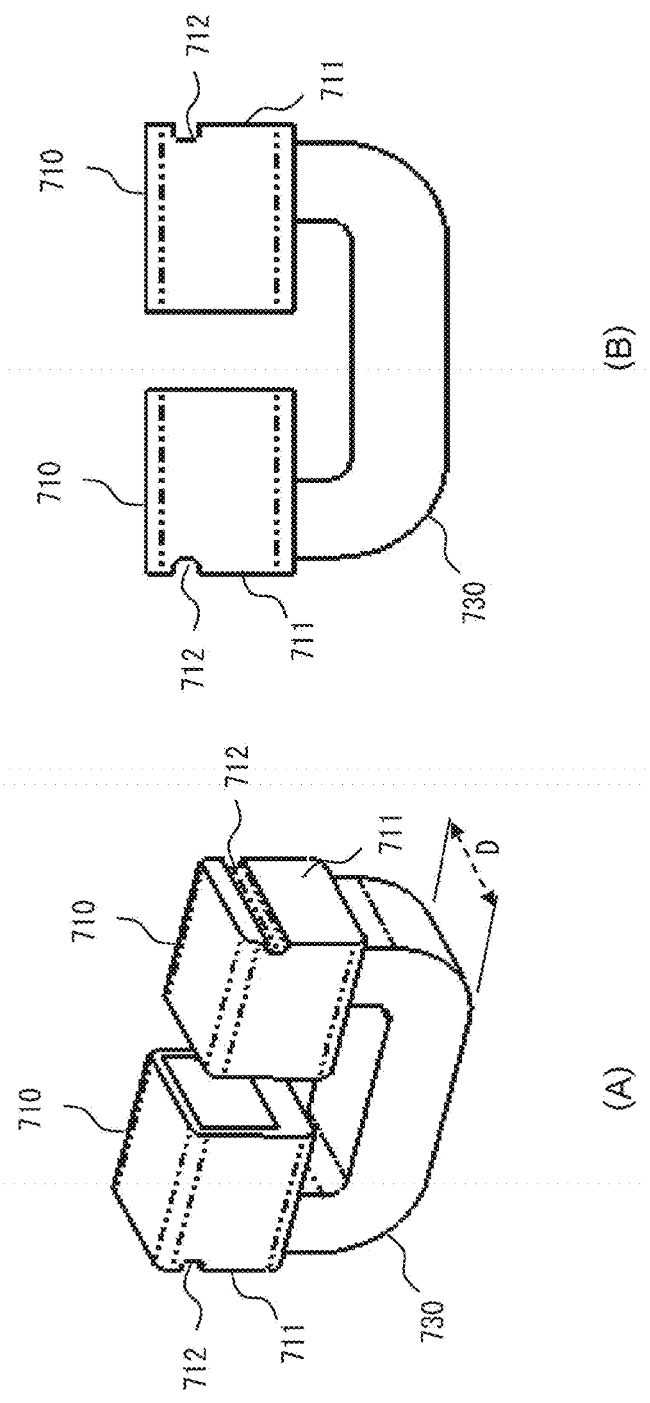
FIGS. 5(A) and 5(B) are an external perspective view and a side view illustrating a first mold portion sealing a part of a core.

FIGS. 5(A) and 5(B) are an external perspective view and a side view illustrating the first mold portion 710 sealing a part of the core 730. FIG. 5(A) is an external perspective view, and FIG. 5(B) is a side view.

As illustrated in FIGS. 5(A) and 5(B), the core 730 is fixed by a mold resin at the time of molding the first mold portion 710. In addition, as illustrated in FIG. 4, a part of the first mold portion 710 is fixed by a mold resin at the time of molding the second mold portion 720. Therefore, no other structure for fixing the core 730 is required, and vibration resistance is excellent because there is no possibility that the looseness of the core 730 due to the wear of the fixed portion occurs, as compared with a case where the core 730 is fixed by a screw, a fitting structure, or the like. In addition, since the fitting structure is unnecessary, the size of the current detector 700, on which the core 730 is mounted, can be reduced, the layout in the power conversion device 100 can be improved, and the circuit board 760 and the control unit 800 can be easily integrated. Furthermore, since the magnetic flux unsaturated portion is sealed by the resin, a deterioration in magnetic characteristic does not occur.

The first mold portion 710 seals a part of the core 730, rather than covering the entire core 730. In addition, as illustrated in FIG. 3(C), a part of the first mold portion 710 is fixed by the mold resin at the time of molding the second mold portion 720. Therefore, the amount of the mold resin for sealing can be reduced, and the size of the current detector 700 can also be reduced.

As illustrated in FIGS. 5(A) and 5(B), the pair of pressing surfaces 711 of the first mold portion 710 have recesses 712 in a direction along the thickness D of the core 730. As illustrated in the cross-sectional views of FIGS. 3(C) and 4, the mold resin for forming the second mold portion 720 at the time of molding the second mold portion 720 enters the recesses 712 to firmly fix the first mold portion 710 and the second mold portion 720. That is, since the pair of pressing surfaces 711 press the core 730 via the first mold portion 710 at the time of molding the second mold portion 720, the dimensional variation of the magnetic gap M and positioning of the magnetic gap M with respect to the second mold portion 720 can be performed with high accuracy. Furthermore, the anchoring effect between the first mold portion 710 and the second mold portion 720 in the recesses 712 results in firm fixation, which is suitable for a core member for a vehicle requiring durability and reliability.

Note that, although it has been described as an example that the recesses 712 are provided in the direction along the thickness D of the core 730, the recesses 712 may be provided in a direction orthogonal to the direction along the thickness D of the core 730. In addition, the recesses 712 may be provided in the direction along the thickness D of the core 730 and in the direction orthogonal to the direction along the thickness D of the core 730, that is, in a cross shape. In addition, the present invention is not limited thereto, and protrusions may be provided, instead of the recesses 712, in at least one of the direction along the thickness D of the core 730 and the direction orthogonal to the direction along the thickness D of the core 730. Further, the recesses and the protrusions may be provided in combination.

Figure 6:
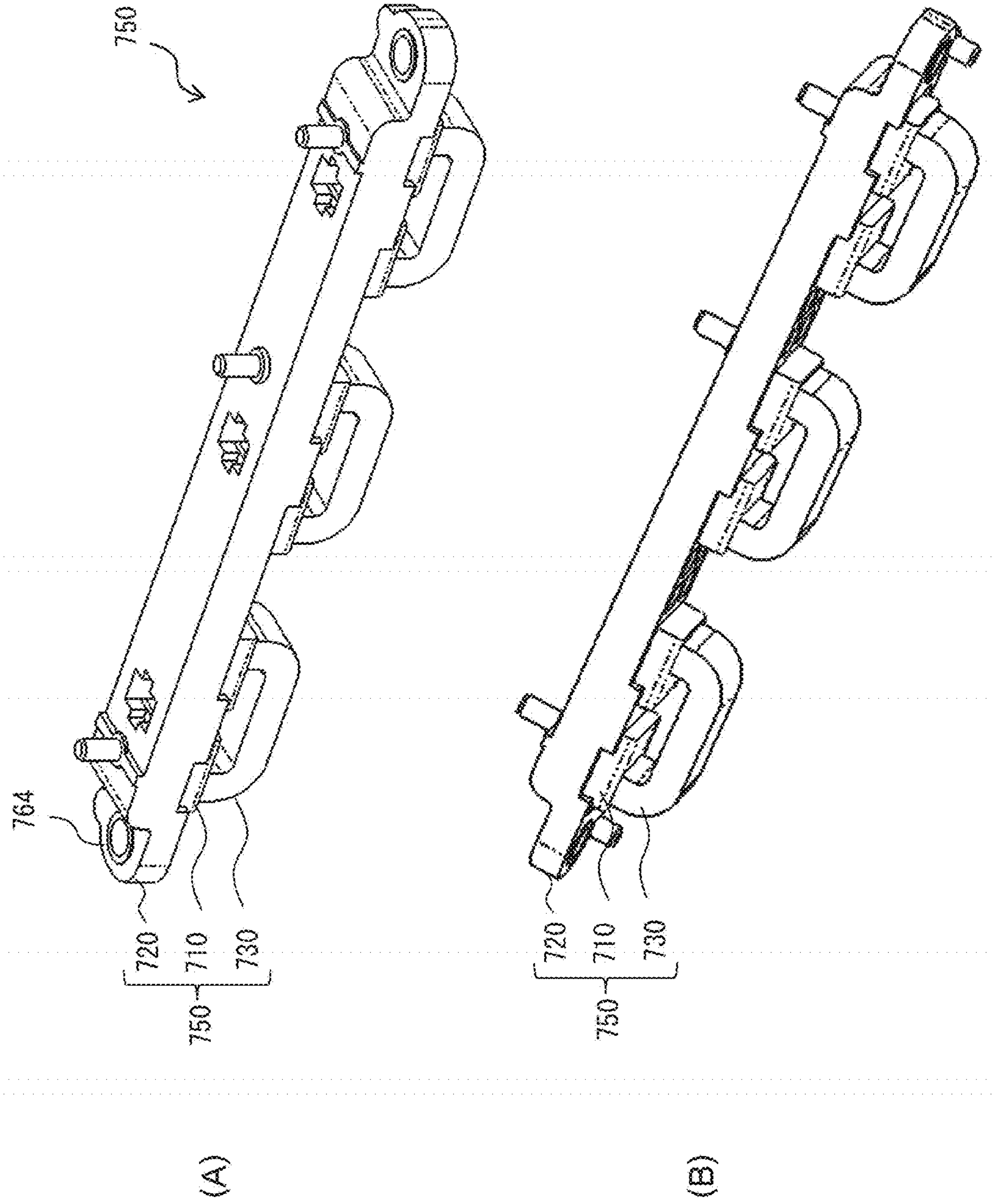
FIGS. 6(A) and 6(B) are external perspective views illustrating a core member.

FIGS. 6(A) and 6(B) are external perspective views illustrating the core member 750. FIG. 6(B) is an external perspective view seen from below the external perspective view illustrated in FIG. 6(A).

As illustrated in FIGS. 6(A) and 6(B), the core member 750 of the current detector 700 includes an annular core 730, a first mold portion 710, and a second mold portion 720. The first mold portion 710 seals a part of the core 730. The second mold portion 720 integrally seals the first mold portion 710, connecting three cores 730 sealed by the first mold portion 710. As illustrated in FIG. 6(B), a part of the first mold portion 710 is exposed from a portion sealed by the second mold portion 720. The second mold portion 720 positions and seals the first mold portion 710 sealing a part of the core 730 at the time of molding, so that the position of the core can be maintained with high accuracy. In addition, as described above, the current detector 700 is fixed to the housing of the power conversion device 100 by screwing the collars 764 to both ends of the second mold portion 720 in a state where the current detector 700 is positioned by the positioning pins 780. The positioning pins 780 are also molded at the time of molding the second mold portion 720, as a result improving accuracy in the position at which the current detector 700 is mounted. Although it has been described as an example that the positioning pins 780 are molded at the same time when the second mold portion 720 is molded, a screw may be molded at the same time when the second mold portion 720 is molded to define the position at which the current detector 700 is mounted. In this case as well, the same effect is obtained.

Although it has been described as an example that the second mold portion 720 connects the three cores 730 sealed by the first mold portion 710 to integrally seal the first mold portion 710, the number of connected cores 730 sealed by the first mold portion 710 is not limited and can be appropriately set.

Figure 7:
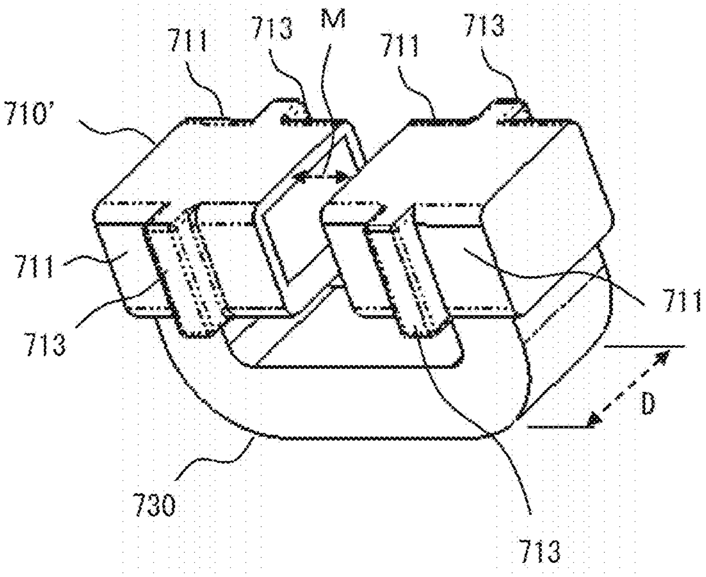
FIG. 7 is an external perspective view illustrating a first mold portion according to a modification.

FIG. 7 is an external perspective view illustrating a first mold portion 710' according to a modification.

In this modification, the pair of pressing surfaces 711 are outer surfaces orthogonal to the direction along the thickness D of the core 730 in the pair of mold portions, and are formed outside the outer shape of the core 730. Furthermore, the pressing surface 711 is provided with a protrusion 713. The protrusion 713 is a direction orthogonal to the direction that the magnetic gap M faces.

The pair of pressing surfaces 711 illustrated in this modification press the core 730 via the first mold portion 710 at the time of molding the second mold portion 720, the dimensional variation of the magnetic gap M and positioning of the magnetic gap M with respect to the second mold portion 720 can be performed with high accuracy. Furthermore, the anchoring effect between the first mold portion 710 and the second mold portion 720 in the protrusions 713 results in firm fixation, which is suitable for a core member for a vehicle requiring durability and reliability.

Although it has been described as an example that the protrusions 713 are provided in the direction orthogonal to the direction that the magnetic gap M faces, the protrusions 713 may be provided in the same direction as the direction that the magnetic gap M faces. In addition, the protrusions 713 may be provided in the direction orthogonal to the direction that the magnetic gap M faces and in the same direction as the direction that the magnetic gap M faces, that is, in a cross shape. In addition, the present invention is not limited thereto, and recesses may be provided, instead of the protrusions 713, in at least one of the direction orthogonal to the direction that the magnetic gap M faces and the same direction as the direction that the magnetic gap M faces. Further, the recesses and the protrusions may be provided in combination.

According to the embodiment described above, the following operational effects can be obtained.

(1) A core member 750 of a current detector includes an annular core 730 having a magnetic gap M, a first mold portion 710 sealing a part of the core 730, and a second mold portion 720 sealing the first mold portion 710. The first mold portion 710 has a pair of pressing surfaces 711 with the magnetic gap M being interposed therebetween, and the pair of pressing surfaces 711 are sealed by the second mold portion 720. As a result, it is possible to provide a highly reliable current detector having high accuracy and vibration resistance in mounting cores. In addition, since the core 730, the first mold portion 710, and the second mold portion 720 are integrally sealed, the size of the current detector can be reduced.

The present invention is not limited to the above-described embodiment, and other aspects conceivable within the scope of the technical idea of the present invention also fall within the scope of the present invention as long as the features of the present invention are not impaired. In addition, a configuration in which the above-described embodiment and modifications are combined may be employed.

REFERENCE SIGNS LIST

100 power conversion device
200 battery
300 motor
400 vehicle control device
500 capacitor
600 inverter
700 current detector
710 first mold portion
711 pressing surface
712 recess
720 second mold portion
722 board mounting surface
723 pressing portion
724 groove portion
730 core
740 electromagnetic conversion element
750 core member
760 circuit board
800 control unit
M magnetic gap
N magnetic flux saturated portion
Bu, Bv, Bw AC bus bar

The invention claimed is:

1. A core member of a current detector, the core member comprising:
an annular core having a magnetic gap;
a first mold portion sealing a part of the annular core; and
a second mold portion sealing the first mold portion,
wherein the first mold portion has a pair of pressing surfaces with the magnetic gap being interposed therebetween, and the pair of pressing surfaces are sealed by the second mold portion, and
wherein the second mold portion has (i) a board mounting surface and (ii) a groove portion recessed from the board mounting surface toward the magnetic gap.

2. The core member of the current detector according to claim 1, wherein
parts of the pair of pressing surfaces of the first mold portion are exposed from the second mold portion.

3. The core member of the current detector according to claim 2, wherein
the first mold portion includes a pair of mold portions each sealing a part of the annular core, with the magnetic gap being interposed therebetween.

4. The core member of the current detector according to claim 3, wherein
recesses and/or protrusions are formed on the pair of pressing surfaces of the first mold portion.

5. The core member of the current detector according to claim 3, wherein the second mold portion includes a pressing portion that presses parts of the pressing surfaces of the first mold portion.

6. The core member of the current detector according to claim 5, wherein the pair of pressing surfaces of the first mold portion are outer surfaces on sides opposite to a magnetic gap side in the pair of mold portions, and are formed outside an outer shape of the annular core.

7. The core member of the current detector according to claim 5, wherein the second mold portion presses parts of the pair of outer surfaces of the first mold portion at the pressing portion.

8. The core member of the current detector according to claim 3, wherein the annular core and the first mold portion protrude from a lower end surface of the second mold portion.

9. The core member of the current detector according to claim 1, wherein the annular core is a wound core formed by spirally winding a magnetic strip.

10. The core member of the current detector according to claim 1, wherein a plurality of cores are sealed by the first mold portion, and the second mold portion seals the first mold portion so as to connect the plurality of cores sealed by the first mold portion.

11. A current detector comprising:

the core member of the current detector according to claim 1;

an electromagnetic conversion element disposed in the magnetic gap;

a circuit board on which the electromagnetic conversion element is mounted; and the board mounting surface on which the circuit board is mounted.

12. The current detector according to claim 11, wherein the electromagnetic conversion element is housed in the groove portion of the second mold portion.

13. A power conversion device comprising:

the current detector according to claim 11;

an inverter that converts DC power into AC power and converts AC power into DC power; and a bus bar that transmits the DC power or the AC power and is inserted into the annular core.

* * * * *